United States Patent
Yugou

(10) Patent No.: US 6,700,384 B2
(45) Date of Patent: Mar. 2, 2004

(54) CIRCUIT FOR DETECTING LEAKAGE IN POWER SUPPLY

(75) Inventor: Masaki Yugou, Kadoma (JP)

(73) Assignee: Sanyo Electric Co., Ltd., Moriguchi (JP)

(*) Notice: Subject to any disclaimer, the term of this patent is extended or adjusted under 35 U.S.C. 154(b) by 24 days.

(21) Appl. No.: 10/203,635

(22) PCT Filed: Feb. 20, 2001

(86) PCT No.: PCT/JP01/01201
§ 371 (c)(1),
(2), (4) Date: Aug. 20, 2002

(87) PCT Pub. No.: WO01/63306
PCT Pub. Date: Aug. 30, 2001

(65) Prior Publication Data
US 2003/0030440 A1 Feb. 13, 2003

(30) Foreign Application Priority Data
Feb. 22, 2000 (JP) .......................................... 2000-43798

(51) Int. Cl.[7] ............................................. G01N 27/416
(52) U.S. Cl. ........................ 324/434; 325/425; 325/503
(58) Field of Search ................................. 324/425, 434, 324/503, 509, 537; 327/545; 361/434; 363/95

(56) References Cited

U.S. PATENT DOCUMENTS

| | | | | |
|---|---|---|---|---|
| 5,760,587 A | * | 6/1998 | Harvey | 324/434 |
| 6,100,702 A | * | 8/2000 | Hagen et al. | 324/551 |
| 6,388,451 B1 | * | 5/2002 | Burba et al. | 324/522 |
| 6,392,414 B2 | * | 5/2002 | Bertness | 324/429 |

* cited by examiner

Primary Examiner—N. Le
Assistant Examiner—Walter Benson
(74) Attorney, Agent, or Firm—Armstrong, Kratz, Quintos, Hanson & Brooks, LLP

(57) ABSTRACT

A power source device comprises a cell unit 12 comprising a plurality of cells 12a. Connected between a positive side terminal and a negative side terminal of the cell unit 12 is a first current line 34 having two voltage dividing resistors 30, 32 interposed therebetween, and is a second current line 22 having two protection resistors 14, 16 and two detection resistors 18, 20 interposed therebetween. An intermediate point 24 of the second line 22 is grounded to a grounding 26 via an insulation resistor 28. The voltage difference between a voltage (V1, V2) detected by the detection resistors 18, 20 and a reference voltage (Vc) obtained from a point of connection 35 between the voltage dividing resistors is input to two Op-Amps 36, 38 serving as the input voltage (V1IN, V2IN). Based on the output voltage (V1OUT, V2OUT) obtained from the Op-Amps 36, 38, leakage occurrence is detected.

8 Claims, 5 Drawing Sheets

CIRCUIT FOR DETECTING LEAKAGE IN POWER SUPPLY

TECHNICAL FIELD

The present invention relates to a leakage detection circuit for use in a power source device provided with an electric motor vehicle, and more particularly to a leakage detection circuit for use in a power source device comprising a plurality of cells.

BACKGROUND ART

Electric motor vehicles are recently provided with a cell unit serving as a power source for a drive motor and generating a high voltage of at least 240 V. The cell unit has mounted an insulation member between the unit and a vehicle body, and is fixed to the vehicle body in a state of floating as electrically separated in order to avoid electrical shock to humans. The cell unit becomes high in voltage as described above, encountering the problem of electric leakage i.e., short-circuit accident between the cell and the vehicle body.

For example, electrolyte of the cell leaks out or, dust clinging to a surface of the cell, etc. is doused with water ingressing into the surface while the vehicle is driven in rainy weather, to impair insulation properties of the insulation member, causing such insulation fault that weak leak current flows, thereby impressing a high voltage of the cell unit on the vehicle body. This increases hazard including an electric shock accident caused by human contact to the vehicle body, and spark occurrence caused by large current discharging with the contact of an electrical conductive tool, etc.

It is conventional practice to detect electric leakage by providing a leakage detection circuit shown in FIG. 6. With the leakage detection circuit, a pair of resistors 5, 6 are connected to opposite ends of a cell unit 1, respectively. An intermediate point between the resistors 5, 6 is grounded to the grounding (vehicle body) via a resistor 2 for detecting electric leakage.

The cell unit 1 comprises a plurality of secondary cells such as nickel hydrogen cells which are connected to one another in series, which is likely to cause breakdown between a point of interconnecting secondary cells and the ground. The breakdown occurrence at such a position entails a problem of creating a dead zone wherein the leakage cannot be detected, or of reducing detection sensitivity as will be described below.

As shown in FIG. 6, a resistor 4 corresponds to breakdown occurrence at an intermediate point of the cell unit 1. Current flows through a leakage detection resistor 2 by way of 2 routes as indicated by an arrow in a solid line and by an arrow in a broken line. Suppose when the currents are i1, i2 as illustrated, the currents are expressed as follows:

$$i1=(B/2)/(Rs+R1+R)$$

$$i2=(B/2)/(Rs+R2+R)$$

In the case where a value of resistance R1 for the resistor 5 is equal to a value of resistance R2 for the resistor 6, the two currents, i1 and i2 are equal in amount and are opposite in flowing direction, so that a voltage V1 detected is zero in spite of electric leakage occurrence. Even if a value of resistance for the resistor 5 is different from a value for the resistor 6, the dead zone will be created when leakage occurs at any point of connection between a plurality of cells constituting the cell unit 1.

In this case, the currents i1 and i2 flow in opposite directions each other, as described above, so that a voltage V1 detected becomes a smaller value, making sensitivity reduced, making it difficult to detect the voltage. Furthermore, when a voltage (+B) of the cell unit 1 varies, the voltage changes a detection value of leakage, whereby entailing a problem that the leakage cannot be detected with high accuracy.

An object of the present invention is to provide a leakage detection circuit for use in a power source device comprising a cell unit of high voltage, which circuit is adapted to detect reliably with a simple structure leakage occurrence in a cell unit, and which is adapted to presume a portion of leakage.

DISCLOSURE OF THE INVENTION

A leakage detection circuit for use in a power source device embodying the present invention comprises:
  a first current path being connected to opposite electrodes of the cell unit comprising a plurality of cells, and having a reference point generating a reference voltage corresponding to potential difference between the opposite electrodes,
  a second current path being connected to the opposite electrodes of the cell unit, and having three points which are different in potential difference, the three points of which an intermediate point is connected to a grounding via an insulation resistor,
  a first and second comparators having one input end to which voltage is applied from each of the two points divided by the intermediate point of the second current path, and having the other input end to which reference voltage is applied from the reference point of the first current path, and
  a detection circuit detecting leakage occurrence based on outputs of the first and the second comparators.

With the leakage detection circuit of the invention described, suppose the leakage occurs at any point of connection between the plurality of cells constituting the cell unit. There is no change in current flowing through the first current path, and the reference voltage generated at the reference point is constant. On the other hand, in the second current path, leaking current flows from the intermediate point through the insulation resistor to the grounding (vehicle body), generating change in potential of the two points divided by the intermediate point, whereby outputs of the first and the second comparators are changed. As a result, the leakage occurrence is detected.

Accordingly, even if leakage voltage varies along with magnitude of leakage current, the leakage can be detected reliably since the reference voltage is fixed.

Stated specifically, a circuit constant of the first and the second current paths is so adjusted that in the event of leakage occurrence at any point of connection between the cells constituting the cell unit, a dead zone in detecting leakage based on the outputs given by the first and the second comparators is contained in an inside of potential distribution region corresponding to one cell, which is included in potential distribution generated between opposite electrodes of the cell unit.

This eliminates the problem of the dead zone in the leakage detection.

A leakage detection circuit for use in a power source unit of the invention comprises:
  a first current line having opposite ends connected to opposite electrodes, respectively, of the cell unit, and having connected in series each other first and second voltage dividing resistors, and having the resistors interposed between the opposite ends,
  a second current line having opposite ends connected to opposite electrodes, respectively, of the cell unit, and having connected in series sequentially a first protection resistor, a first detection resistor, a second detection resistor, and a second protection resistor, and having the resistors interposed between the opposite ends, a grounding connection line connecting to a grounding via an insulation resistor a point of connection between the first detection resistor and the second detection resistor which are interposed on the second current line, a first comparator having one input end connected to a point of connection between the first protection resistor and the first detection resistor which are interposed on the second current line, and having the other input end connected to a point of connection between the first voltage dividing resistor and the second voltage dividing resistor which are interposed on the first current line, a second comparator having one input end connected to a point of connection between the second detection resistor and the second protection resistor which are interposed on the second current line, and having the other input end connected to a point of connection between the first voltage dividing resistor and the second voltage dividing resistor which are interposed on the first current line, and a detection circuit detecting leakage occurrence based on outputs of the first and the second comparators.

With the leakage detection circuit of the invention described, suppose the leakage occurs at any point of connection between the plurality of cells constituting the cell unit. There is no change in current flowing through the first current line, and a reference voltage generated at a point of connection (reference point) between the first and the second voltage dividing resistors is therefore constant. On the other hand, in the second current line, leaking current flows from a point of connection (intermediate point) between the first and the second detection resistors through the grounding connection line and the insulation resistor to the grounding (vehicle body), generating change corresponding to the magnitude of the leakage current in potentials of a point of connection between the first protection resistor and the first detection resistor and in potentials of a point of connection between the second detection resistor and the second protection resistor, whereby outputs of the first and the second comparators are changed. As a result, the leakage occurrence is detected.

Accordingly, even if a leakage voltage varies along with the magnitude of the leakage current, the leakage occurrence can be detected reliably since the reference voltage is fixed.

Stated specifically, the first and the second comparators each outputs two signals different in potential corresponding to magnitude relation between a voltage impressed to one input end and a reference voltage impressed to the other input end. For example, the first comparator outputs a signal "high" when the voltage to be impressed to the one input end is greater than the voltage to be impressed to the other input end. The second comparator outputs a signal "high" when the voltage to be impressed to the one input end is smaller than the voltage to be impressed to the other input end.

Stated further specifically, the detection circuit comprises a photocoupler which is connected to an output end of the first comparator and to an output end of the second comparator. The photocoupler comprises a light-emitting diode for emitting light corresponding to potentials of the output ends, and a phototransistor to be turned on by light-emitting of the light-emitting diode, and detects leakage occurrence based on on/off of the phototransistor.

Stated furthermore specifically, values of resistance for the first and the second voltage dividing resistors interposed on the first current line, for the first and the second protection resistors interposed on the second current line, and for the first and the second detection resistors interposed on the second current line are so adjusted that in the event of the leakage occurrence at any point of connection between the plurality of cells constituting the cell unit, the dead zone in detecting leakage, wherein a voltage to be impressed to the one input end of the first comparator is greater than a reference voltage to be impressed to the other input end, and a voltage to be impressed to one input end of the second comparator is smaller than a reference voltage to be impressed to the other input end, is contained in an inside of a potential distribution region corresponding to one cell, which is included in potential distribution generated between opposite electrodes of the cell unit.

Consequently, even in the event of the leakage occurrence at any point of connection between the plurality of cells comprising the cell unit, the potential at the point of the leakage occurrence does not correspond to the dead zone.

The leakage detection circuit for use in the power source device embodying the invention, as described above, the leakage occurrence at the point of connection between a plurality of cells comprising the cell unit can be reliably detected. This can forestall electric shock accidents.

BEST MODE FOR CARRYING OUT THE INVENTION

With reference to the drawings, a detailed description will be given of a leakage detection circuit embodying the invention for use in a power source unit, which is mounted on an electric motor vehicle.

Figure 1:
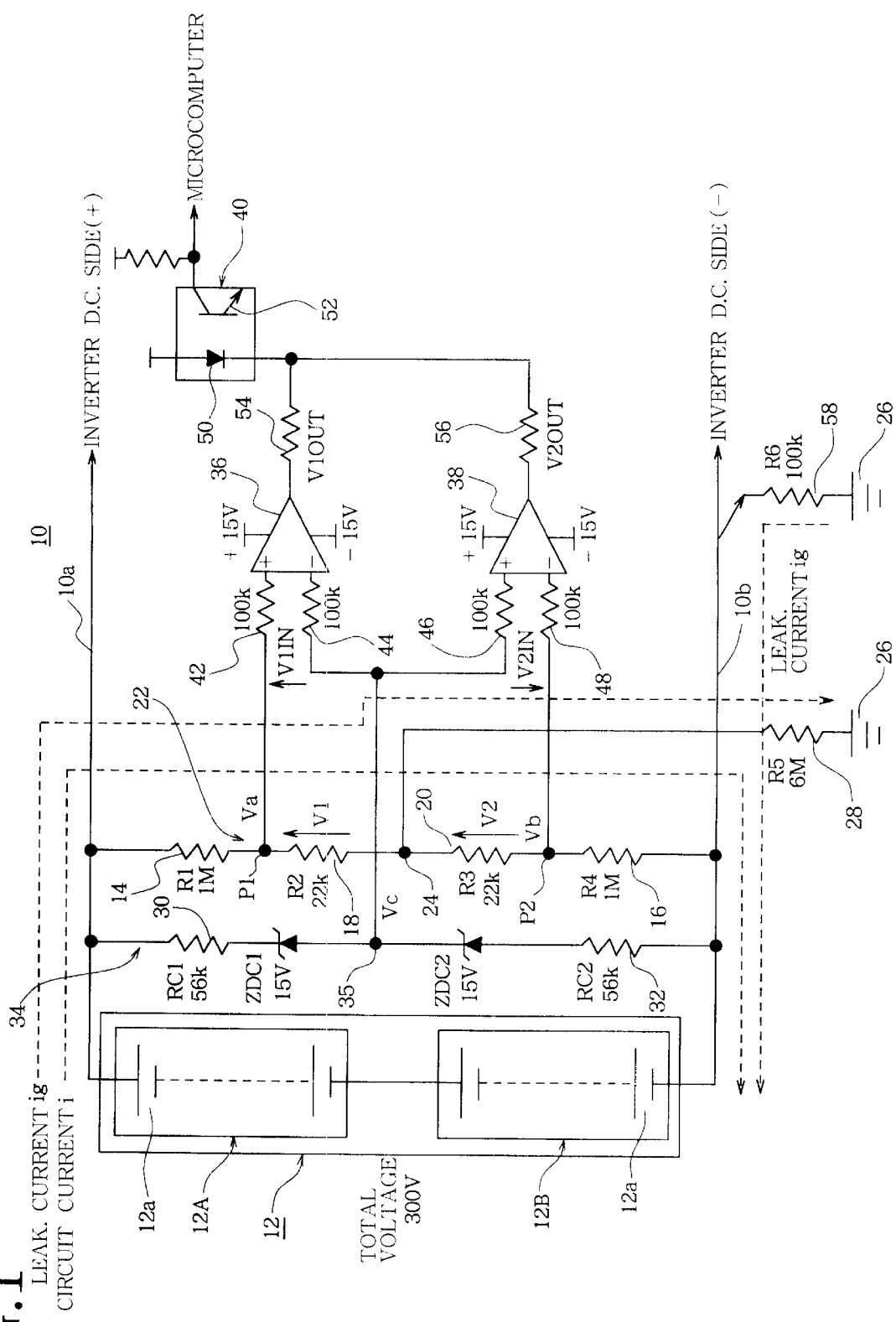
FIG. 1 is an example construction of a leakage detection circuit embodying the invention.

As shown in FIG. 1, two cell modules 12A, 12B comprises a plurality of secondary cells 12a, which are connected in series. The two cell modules 12A, 12B constitute a cell unit 12 which is mounted on a vehicle body through an insulation member. Nickel hydrogen cells, etc. are used as secondary cells 12a. Obtained between a positive terminal and a negative terminal of the cell unit 12 is, for example, 300V, in total voltage.

A positive-side power line 10a and a negative-side power line 10b extend, respectively, from a positive and a negative terminals of the cell unit 12, and are connected to an inverter which is not shown. The inverter comprises a switching element such as IGBT (Insulated Gate Bipolar Transistor), etc. and converts d.c. power to a.c. power to supply the power to a drive motor.

The leakage detection circuit 10 of the invention comprises a first current line 34 and a second current line 22 which are connected to each other in parallel between the positive-side power line 10a and the negative-side power line 10b. Interposed on the first current line 34 are a first voltage dividing resistor 30 and a second voltage dividing resistor 32 each having a value of resistance of 56 kΩ, which are related each other in parallel. Interposed on the second current line 22 are a first protection resistor 14 and a second protection resistor 16 each having a high value of resistance of 1MΩ, which are related each other in parallel. Interposed between the two protection resistors 14, 16 are a first detection resistor 18 and a second detection resistor 20 each having a value of resistance of 22 kΩ, which are related each other in parallel.

A point of connection 24 between the first and the second detection resistors 18, 20 which are interposed on the second current line 22 is connected to a ground (vehicle body) through an insulation resistor 28 having a high value of resistance of 6MΩ.

The leakage detection circuit of the invention comprises a first Op-Amp 36 and a second Op-Amp 38. A point of connection 35 (reference point) between the first voltage dividing resistor 30 and the second voltage dividing resistor 32 which is interposed on the first current line 34 is connected to a negative input terminal of the first Op-Amp 36 through a current limiting resistor 44 having a value of resistance of 100 kΩ, and is connected to a positive terminal of the second Op-Amp 38 through a current limiting resistor 46 having a value of resistance of 100 kΩ. A point of connection P1 between the first protection resistor 14 and the first detection resistor 18 which are interposed on the second current line 22 is connected to a positive input terminal of the first Op-Amp 36 through a current limiting resistor 42 having a value of resistance of 100 kΩ. A point of connection P2 between the second protection resistor 16 and the second detection resistor 20 is connected to a negative input terminal of the second Op-Amp 38 through a current limiting resistor 48 having a value of resistance of 100 kΩ.

Op-Amps 36, 38 are given defined power source voltages, +15V, -15V, respectively, as illustrated.

The leakage detection circuit of the present invention comprises a photocoupler 40 having a light-emitting diode 50 and a phototransistor 52. An output end of the first Op-Amp 36 and that of the second Op-Amp 38 are interconnected to, respectively, via resistors 54, 56, and a point of the interconnection is connected to the light-emitting diode 50. The leakage occurrence causes the light-emitting diode to emit light, as will be described below, to have the phototransistor 52 electrically conducted, notifying the leakage occurrence to a microcomputer not shown.

When the leakage does not occur, the cell unit 12 of high voltage is insulated from the grounding (vehicle body) 26 by an insulation resistor 28 to be in a floating state, so that leakage current does not flow through the first and the second detection resistors, 18, 20 of the second current line 22. Accordingly, the leakage voltage will not be generated between opposite ends of any of the detection resistors 18, 20.

For example, suppose a negative terminal of the cell unit 12 is grounded by fault via a ground resistor 58 having a resistance value of 100 kΩ, as shown in FIG. 1, causing leakage occurrence. In this case, the negative-side power line 10b extending from a negative terminal of the cell unit 12 is grounded to the grounding 26(vehicle) via the ground resistor 58, as shown in FIG. 1. Accordingly, the leakage current flows through the first and second protection resistors 14, 16, the first detection and second detection resistors 18, 20, the insulation resistor 28, and the ground resistor 58, via the grounding 26, generating a voltage V1 and a voltage V2 resulted from the leakage between opposite ends of each of the first and second detection resistors 18, 20.

Voltage differences V1IN and V2IN between each of the voltages V1, V2 and a reference voltage Vc impressed from the reference point 35 of the first current line 34 are respectively input to the first and second Op-Amps 36, 38. The voltage differences are compared with the predetermined values, respectively, in the Op-Amps 36, 38. When the input voltages V1IN and V2IN become greater than the predetermined value, the Op-Amps 36, 38 each produce output voltages V1OUT and V2OUT.

Figure 5:
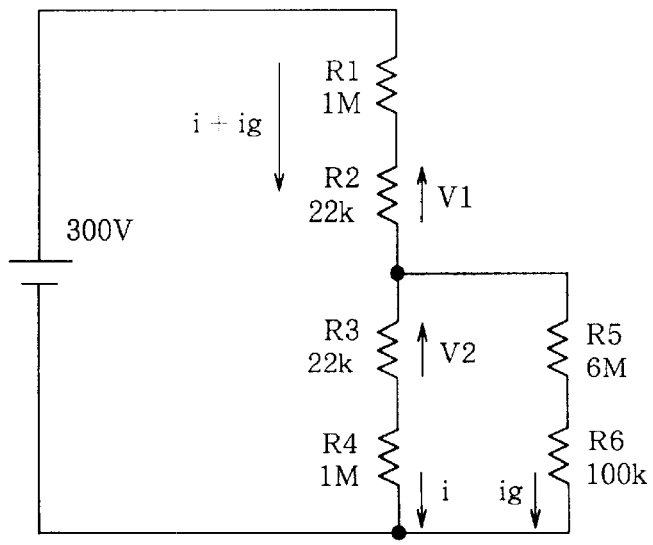
FIG. 5 is a diagram showing an equivalent circuit which is part of a circuit shown in FIG. 1 and a circuit constant.
Figure 6:
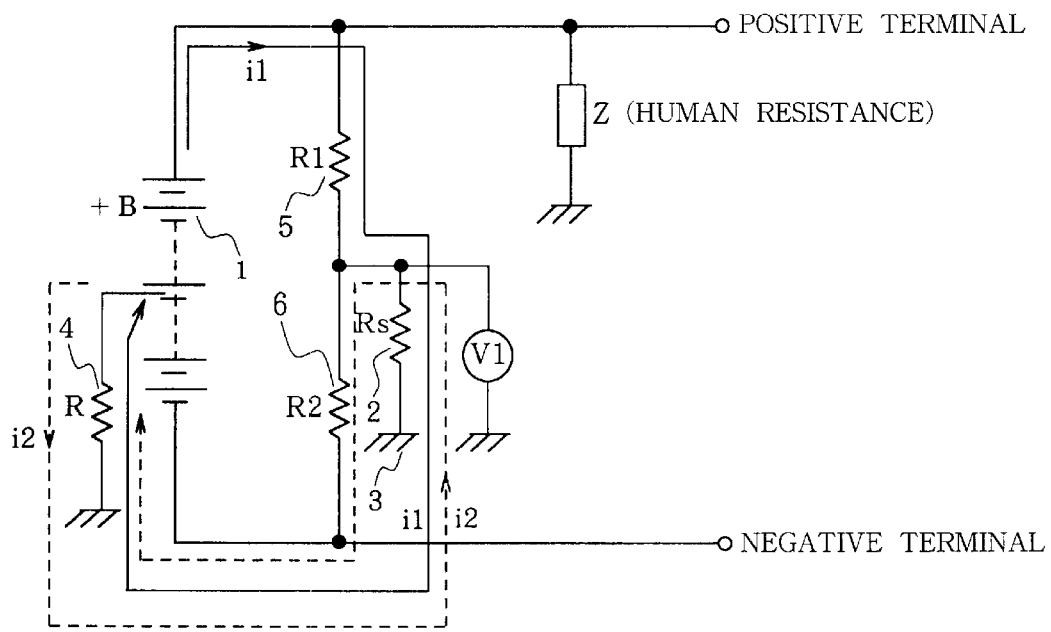
FIG. 6 is a circuit diagram showing the construction of a conventional leakage detection circuit.

In the example shown in FIG. 1, the negative terminal of the cell unit 12 is grounded by fault via the ground resistor 58 having a resistance value of 100 kΩ, and a leakage current ig flows, forming an equivalent circuit shown in FIG. 5. With the equivalent circuit, a following relationship is obtained, wherein i is a circuit current.

$i=138.5V/1.022MΩ=135.5 \mu A$ $ig=138.5V/6.1MΩ=22.7 \mu A$ $V1=(135.5 \mu A+22.7 \mu A)\times 22 kΩ=3.48V$ $V2=135.5 \mu A \times 22 kΩ=2.98V$ $V1IN=(138.5V+3.48V)-150V=-8.02V$ $V2IN=(138.5V-2.98V)-150V=-14.48V$ Accordingly, V1OUT=-15V and V2OUT=+15V, with the result that the light-emitting diode 50 of the photocoupler 40 emits light to have the phototransistor 52 turned on. The microcomputer detects that a signal from the phototransistor 52 is changed over from high to low, thereby determining the leakage occurrence.

Furthermore, in the case where the leakage occurs at a positive terminal side of the cell unit 12, the same result as described is obtained.

When the leakage does not occur, only the circuit current i is generated, V1IN=3.23V, V2IN=-3.23V, V1OUT=+15V, and V2OUT=+15V, to have the photocoupler 40 held off.

Figure 2:
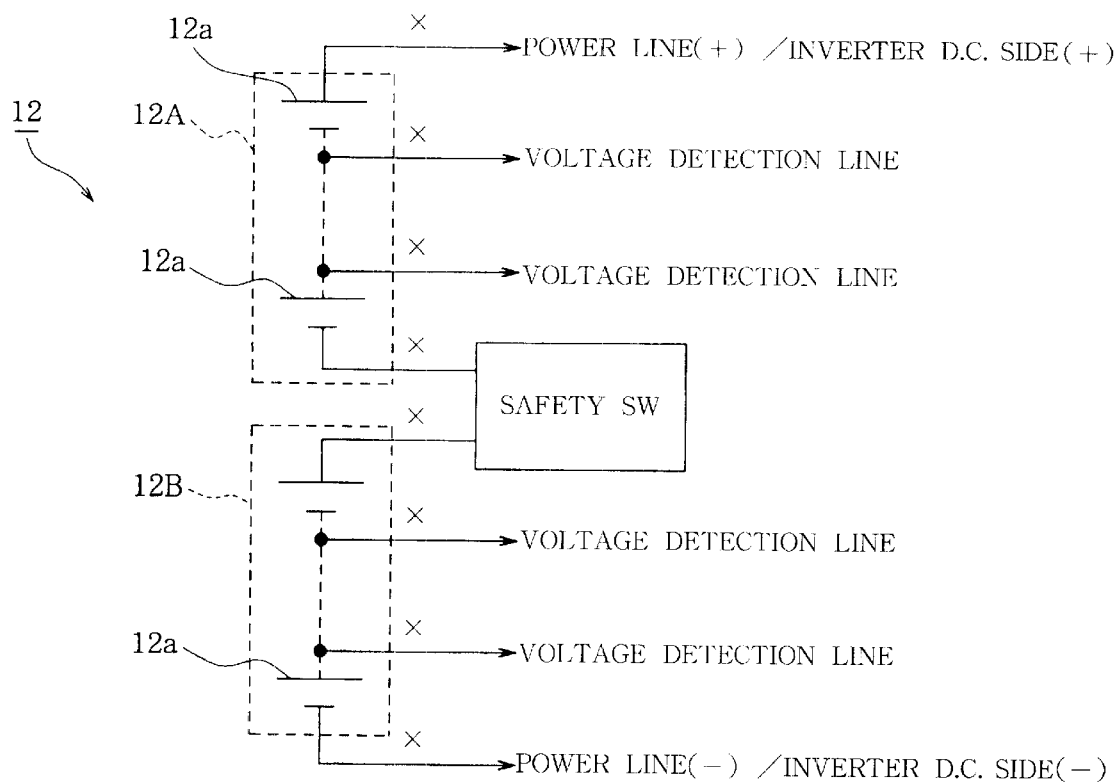
FIG. 2 is a diagram for indicating a point having a possibility of leakage occurrence in a cell unit.

With the cell unit 12, power lines extend from the positive and negative terminals of the cell unit 12, respectively, as shown in FIG. 2, and voltage detection lines extend from points of connection between cells 12a, and lines further extend from points of connection between the cell modules 12A and 12B to a safety switch, so that if any line of the lines described above is grounded by fault, the leakage occurs. There is a possibility of the leakage occurrence at each point indicated by cross marks shown in FIG. 2.

Input voltages V1IN and V2IN shown in FIG. 1 are found as for each point wherein there is a possibility of the leakage occurrence, and the result found is given as follows. In this case, the cell unit 12 comprises 16 cells, and the unit has an output voltage of 240V(=15V×16).

| (1) power line (±)/d.c. side of inverter (±) | ±120 V |
| (2) voltage detection line of cell module | ±15 V × 8 points |
| (3) safety switch line | 0 V |

Figure 3:
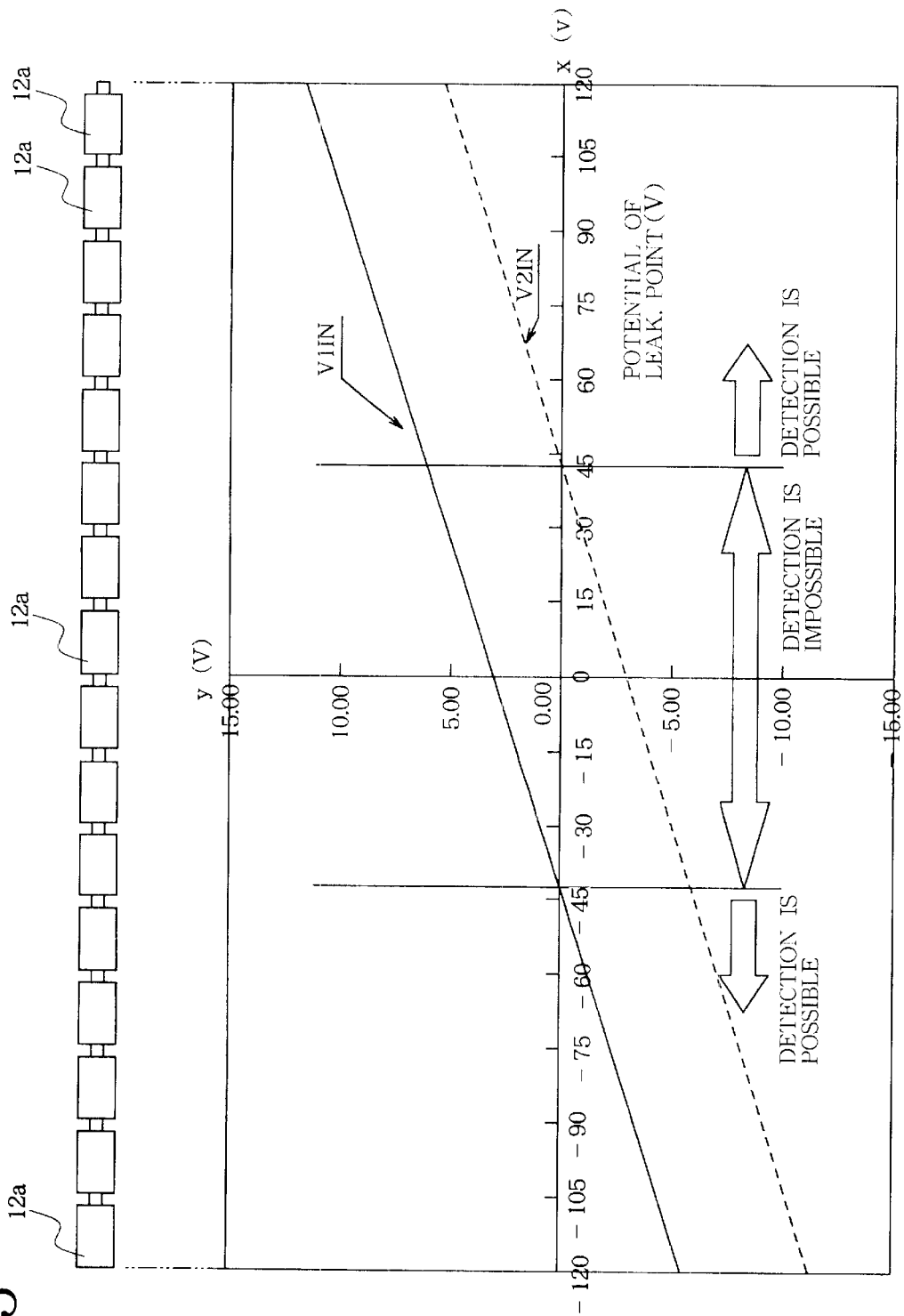
FIG. 3 is a graph showing a relationship between a potential of leakage occurrence and an input voltage to two Op-Amps.

FIG. 3 is a graph showing input voltage V1IN and V2IN, respectively, in a solid line and in a broken line when the leakage occurs at each point, wherein a potential at each point of leakage occurrence is plotted as the X-axis and a potential of input voltage V1IN and V2IN is plotted as the Y-axis in the case where the ground resistor 58 is 100 kΩ.

FIG. 3 shows that the following three cases are present depending on a point of leakage occurrence: ① V1IN>0, V2IN<0, ② V1IN<0, V2IN<0, ③ V1IN>0. In the cases of ② and ③ the photocoupler is turned on to permit the leakage detection, while in the case of ① the photocoupler is not turned on, and thereby the leakage cannot be detected. That is, with the leakage detection circuit 10 having the circuit constant described above, the leakage cannot be detected at points of leakage within ±45V shown in FIG. 3, whereby generating a dead zone.

In this embodiment the influence of the dead zone is avoided by adjusting the circuit constant of the leakage detection circuit 10, as will be described below.

Table 1 shows the result of calculating the input voltage V1IN and V2IN at representative points (±120V, ±90V, ±30V, 0V) out of the points (1), (2), and (3) each having a possibility of the leakage occurrence as described above.

TABLE 1

| | leak. Resist. | −120V | −90V | −30V | 0V | 30V | 90V | 120V |
|---|---|---|---|---|---|---|---|---|
| V1IN | short circuit | −6.63 | −4.33 | 0.28 | 2.58 | 4.89 | 9.49 | 11.8 |
| V2IN | | −11.8 | −9.49 | −4.89 | −2.58 | −0.28 | 4.33 | 6.63 |
| V1IN | 100k | −6.49 | −4.22 | 0.31 | 2.58 | 4.85 | 9.39 | 11.66 |
| V2IN | | −11.66 | −9.39 | −4.85 | −2.58 | −0.31 | 4.22 | 6.49 |

In order to permit the leakage detection at any point wherein there is a possibility of the leakage occurrence, both of the input voltage V1In and V2In at the point of the leakage occurrence should be made positive or negative. The conditions for this are as follows:

(1) X-intercept of the input voltage V1IN and V2IN shown in FIG. 3 is in the range of 0 to 15V or 0 to −15V.

(2) the intersection of a solid line showing variation of the leakage detection voltage Va (potential of P1 in FIG. 1), Vb (potential of P2 in FIG. 1) and the reference potential Vc is in the range of 0 to 15V or 0 to −15V.

FIG. 2 shows the result obtained by altering the circuit constant so as to fulfill the above conditions.

TABLE 2

| | R1(k) | R2(k) | R3(k) | R4(k) | RC1(k) | RC2(k) | ZDC1 | ZDC2 |
|---|---|---|---|---|---|---|---|---|
| Before alter. | 1000 | 22 | 22 | 1000 | 56 | 56 | 15V | 15V |
| After alter. | 3450 | 10 | 10 | 3300 | 58.5 | 56 | 15V | 15V |

Figure 4:
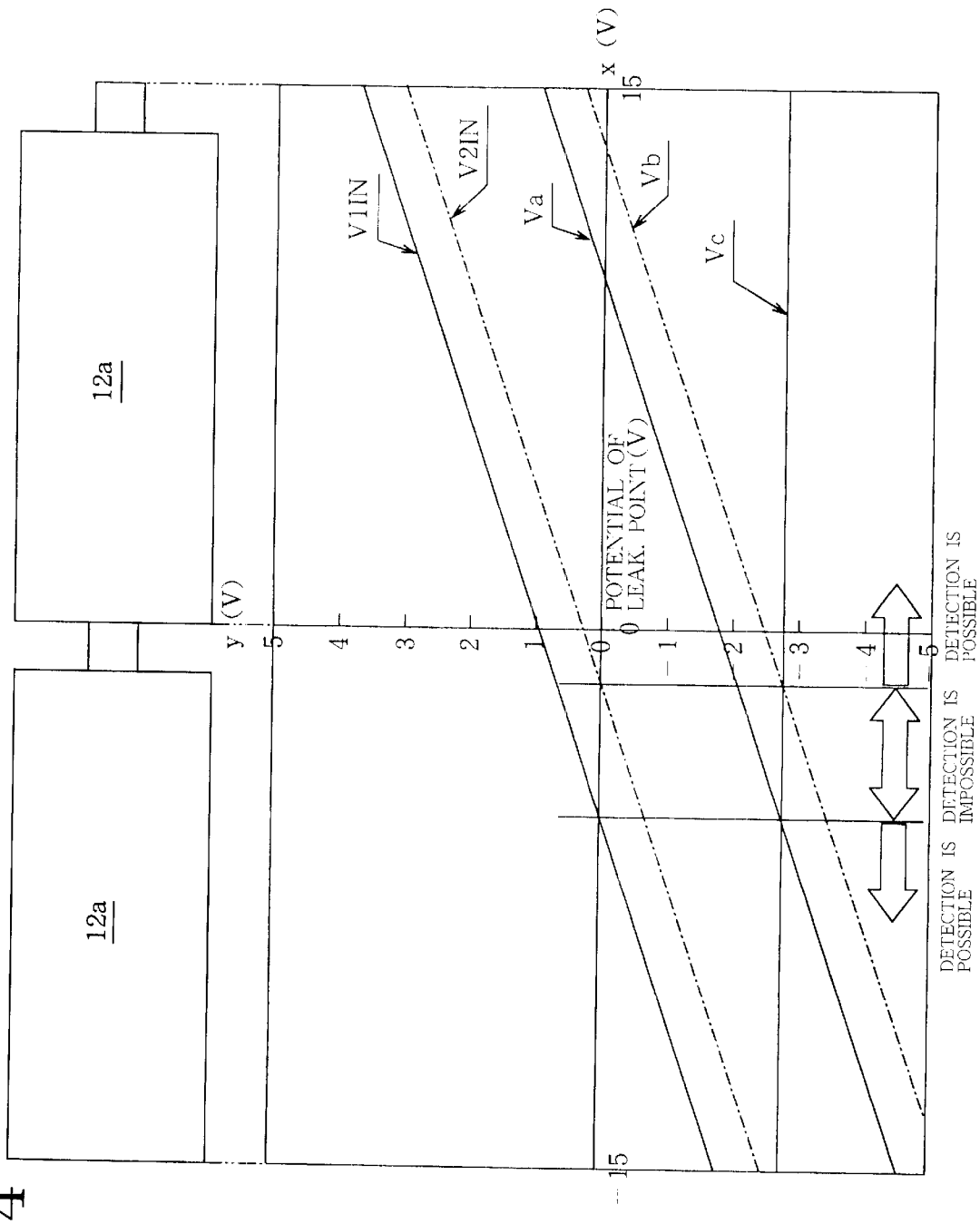
FIG. 4 is a graph showing an example for eliminating the problem of a dead zone by altering a circuit constant as in the same manner as FIG. 3.

Furthermore, FIG. 4 shows a graph in the same manner as FIG. 3 in the case where the ground resistor 58 is 100 kΩ with the leakage detection circuit 10 after the alteration of the circuit constant.

Table 3 further shows the result obtained by calculating the input voltage V1In and V2IN after the alteration of the circuit constant at each point of leakage occurrence.

TABLE 3

| | leak. Resist. | −120V | −90V | −30V | 0V | 30V | 90V | 120V |
|---|---|---|---|---|---|---|---|---|
| V1IN (Va) | short circuit | −25.42 (−28.04) | −18.84 (−21.46) | −5.68 (−8.3) | 0.9 (−1.72) | 7.48 (4.86) | 20.64 (18.02) | 27.21 (24.59) |
| V2IN (Vb) | | −26.12 (−28.74) | −19.54 (−22.16) | −6.39 (−9.01) | 0.19 (−2.43) | 6.77 (4.15) | 19.92 (17.3) | 26.5 (23.88) |
| V1IN (Va) | 100k | −25.09 (−27.71) | −18.59 (−21.21) | −5.6 (−8.22) | 0.89 (−1.73) | 7.39 (4.77) | 20.37 (17.75) | 26.87 (24.25) |
| V2IN (Vb) | | −25.79 (−28.41) | −19.3 (21.92) | −6.31 (−8.93) | 0.18 (−2.44) | 6.68 (4.06) | 19.66 (17.04) | 26.16 (23.54) |

According to the above calculation results, it is found that the leakage can be detected as for any point wherein there is a possibility of leakage occurrence by altering the circuit constant, i.e. by suitably adjusting the ratio of the protection resistor to the detection resistor (value of the leakage detection voltage Va and that of Vb) and the ratio of the voltage dividing resistor (value of the reference voltage Vc).

With the leakage detection circuit 10 shown in FIG. 1, the point wherein there is a possibility of the leakage occurrence can be identified in advance, so that the leakage can be detected at each point by setting each value of the protection, detection, and voltage dividing resistors so as to shift the dead zone of the leakage detection from the leakage point.

What is claimed is:

1. A leakage detection circuit for use in a power source device provided with a cell unit comprising a plurality of cells, the leakage detection circuit for use in the power source device being characterized in that the circuit comprises:

a first current path being connected to opposite electrodes of the cell unit, and having a reference point generating a reference voltage corresponding to potential difference between the opposite electrodes, a second current path being connected to the opposite electrodes of the cell unit, and having three points which are different in potential difference, the three points of which an intermediate point is connected to a grounding via an insulation resistor, a first and second comparators having one input end to which voltage is applied from each of the two points divided by the intermediate point of the second current path, and having the other input end to which reference voltage is applied from the reference point of the first current path, and a detection circuit detecting leakage occurrence based on outputs of the first and the second comparators.

2. A leakage detection circuit for use in a power source device according to claim 1 wherein a circuit constant of the first and the second current paths is so adjusted that in the event of leakage occurrence at any point of connection between the cells constituting the cell unit, a dead zone in detecting leakage based on the outputs given by the first and the second comparators is contained in an inside of potential distribution region corresponding to one cell, which is included in potential distribution generated between opposite electrodes of the cell unit.

3. A leakage detection circuit for use in a power source unit provided with a cell unit comprising a plurality of cells, the leakage detection circuit for use in the power source device being characterized in that the circuit comprises:

a first current line having opposite ends connected to opposite electrodes, respectively, of the cell unit, and having first and second voltage dividing resistors connected in series each other, and having the resistors interposed between the opposite ends, a second current line having opposite ends connected to opposite electrodes, respectively, of the cell unit, and having connected in series sequentially a first protection resistor, a first detection resistor, a second detection resistor, and a second protection resistor, and having the resistors interposed between the opposite ends, a grounding connection line connecting to a grounding via an insulation resistor a point of connection between the first detection resistor and the second detection resistor which are interposed on the second current line, a first comparator having one input end connected to a point of connection between the first protection resistor and the first detection resistor which are interposed on the second current line, and having the other input end connected to a point of connection between the first voltage dividing resistor and the second voltage dividing resistor which are interposed on the first current line, a second comparator having one input end connected to a point of connection between the second detection resistor and the second protection resistor which are interposed on the second current line, and having the other input end connected to a point of connection between the first voltage dividing resistor and the second voltage dividing resistor which are interposed on the first current line, and a detection circuit detecting leakage occurrence based on outputs of the first and the second comparators.

4. A leakage detection circuit for use in a power source device according to claim 3 wherein the first and the second comparators each outputs two signals different in potential corresponding to magnitude relation between a voltage impressed to one input end and a reference voltage impressed to the other input end.

5. A leakage detection circuit for use in a power source device according to claim 3 wherein the circuit comprises a photocoupler which is connected to an output end of the first comparator and to an output end of the second comparator, and which comprises a light-emitting diode for emitting light corresponding to potentials of the output ends and a phototransistor to be turned on by light-emitting of the light-emitting diode, and the circuit detects leakage occurrence based on on/off of the phototransistor.

6. A leakage detection circuit for use in a power source device according to claim 3 wherein a dead zone in detecting leakage is generated when a voltage to be impressed to one input end of the first comparator is greater than a reference voltage to be impressed to the other input end, and when a voltage to be impressed to one input end of the second comparator is smaller than a reference voltage to be impressed to the other input end.

7. A leakage detection circuit for use in a power source device according to claim 3 wherein in the event of the leakage occurrence at any point of connection between the plurality of cells constituting the cell unit, the dead zone in detecting leakage based on the outputs of the first and the second comparators is contained in an inside of a potential distribution region corresponding to one cell, which is included in potential distribution generated between the opposite electrodes of the cell unit.

8. A leakage detection circuit for use in a power source device according to claim 7 wherein values of resistance for the first and the second voltage dividing resistors which are interposed on the first current line, for the first and the second protection resistors, and for the first and the second detection resistors which are interposed on the second current line are so adjusted as to serve as a circuit constant of the first and the second current line.

* * * * *